(12) United States Patent
Tian et al.

(10) Patent No.: US 7,741,221 B2
(45) Date of Patent: Jun. 22, 2010

(54) METHOD OF FORMING A SEMICONDUCTOR DEVICE HAVING DUMMY FEATURES

(75) Inventors: Ruiqi Tian, Austin, TX (US); Willard E. Conley, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1222 days.

(21) Appl. No.: 11/302,769

(22) Filed: Dec. 14, 2005

(65) Prior Publication Data

US 2007/0134921 A1 Jun. 14, 2007

(51) Int. Cl.
*H01L 21/302* (2006.01)
(52) U.S. Cl. .................... 438/689; 438/14; 438/926; 216/41; 216/59; 716/11; 716/19; 716/21
(58) Field of Classification Search .................. None
See application file for complete search history.

(56) References Cited

U.S. PATENT DOCUMENTS

| | | | |
|---|---|---|---|
| 6,395,438 B1 | 5/2002 | Bruce et al. | |
| 6,396,158 B1 | 5/2002 | Travis et al. | |
| 6,459,156 B1 | 10/2002 | Travis et al. | |
| 6,489,083 B1 | 12/2002 | Smith et al. | |
| 6,593,226 B2 | 7/2003 | Travis et al. | |
| 6,656,814 B2 | 12/2003 | Yoo et al. | |
| 6,711,732 B1 | 3/2004 | Dai et al. | |
| 6,905,967 B1* | 6/2005 | Tian et al. | 438/697 |
| 2002/0184606 A1* | 12/2002 | Ohba et al. | 716/11 |
| 2003/0177464 A1* | 9/2003 | Takechi et al. | 716/10 |
| 2004/0058550 A1 | 3/2004 | Mono et al. | |
| 2005/0172248 A1* | 8/2005 | Shimada et al. | 716/5 |
| 2009/0044164 A1* | 2/2009 | Lee | 716/9 |
| 2009/0106725 A1* | 4/2009 | Wang et al. | 716/10 |

\* cited by examiner

*Primary Examiner*—Anita K Alanko
(74) *Attorney, Agent, or Firm*—Kim-Marie Vo (57) ABSTRACT

A method for forming a semiconductor device includes providing a plurality of features in a layout, selecting critical features from the plurality of features, placing a first plurality of short-range dummy etch features in the layout at a first distance from the critical features to increase the feature density near the critical features, wherein each of the first plurality of short-range dummy etch features has a first width, removing at least one of the first plurality of short-range dummy etch features from the layout that will subsequently interfere with the electrical performance of at least one active feature so that a second plurality of short-range dummy etch features remains, and using the layout to pattern a layer on a semiconductor substrate.

19 Claims, 7 Drawing Sheets

METHOD OF FORMING A SEMICONDUCTOR DEVICE HAVING DUMMY FEATURES

FIELD OF THE INVENTION

This invention relates generally to semiconductor devices, and more specifically, to forming semiconductor devices with dummy etch features.

BACKGROUND

To increase device speed, the lengths of gate electrodes are decreasing. At the small dimensions that are currently used, it is important that the gate electrode has straight sidewalls. If the top of the gate electrode is etched more than the bottom, then the small area of the top of the gate electrode makes it difficult to salicide the top of the gate electrode. If, instead, the bottom of the gate electrode is narrower than the top, a shadow effect occurs making it difficult to implant source and drain regions adjacent the gate electrode. The profile of the sidewalls is predominantly determined by etching.

Etching also can create a nonuniformity of the critical dimension of features, such as gate electrodes, across the wafer. For example, the dimension of a feature in one area of the circuit or wafer may be larger than the dimension of another feature in a different area of the wafer even though the two features are intended to have the same dimension. This non-uniformity of dimension can be caused by non-uniformity in the location of neighboring features. This nonuniformity in neighbor feature location is typically most important within 1 to 2 micrometers of the feature with the critical dimension. In addition to affecting the critical dimension of the feature the nonuniformity of neighboring feature location also negatively impacts the final gate profile of the feature. Additionally, variations in gate profiles also affect critical dimensions when the variations affect the bottom portions of the gates.

One proposal for improving the dimension and gate profile uniformity is to have dummy features placed close to, but not in contact with, isolated feature edges. This may be performed manually by placing dummy features having predetermined shapes and dimensions near features. However, this is time consuming and subject to error. In addition, the addition of dummy features may negatively affect pattern density across a wafer, which can negatively impact the depth of focus of photolithography and chemical mechanical processing (CMP). Hence, a fast, robust, and efficient method for placing dummy features that does not negatively impact photolithography or CMP is needed.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Three terms are defined below to aid in the understanding the specification.

1. Active circuit features are features that correspond to the designed circuitry for a semiconductor device. The active features include portions of transistors, capacitors, resistors, or the like. Active features include power supply features, which are designed to operate at a substantially constant potential, and signal features, which are designed to operate at one potential under one set of electronic conditions and a different potential at another set of electronic conditions. Active circuit features are not features that help control the processing of a substrate, such as alignment marks, structures for measuring dimensions of features ("CD bars"), electrical test structures, and the like. Active features are also not features having a primary (most important) function of protecting a semiconductor device from post-fabrication environmental conditions, such as an edge ring seal around a die.

2. Dummy features include features printed onto a semiconductor device substrate, where the features are not any of the other types of features described above. Different types of dummy features are used in semiconductor devices for various reasons. Dummy bit lines are used in memory arrays along the outermost edges to allow all the active bit lines in the array to be uniformly patterned. Unlike dummy bit lines, dummy etch features are dummy features added at a feature level of a mask of a semiconductor device to improve etching characteristics at the current or a subsequently formed level. A dummy etch feature is not required for the proper operation of a device.

3. Active device area is the portion of the die that is used in conjunction with the active circuit features to form a device. The active device area does not include the peripheral area of a die (i.e., the portion of a die that lies between the integrated circuit area and the scribe lines) or any insulated regions on the die.

Figure 1:
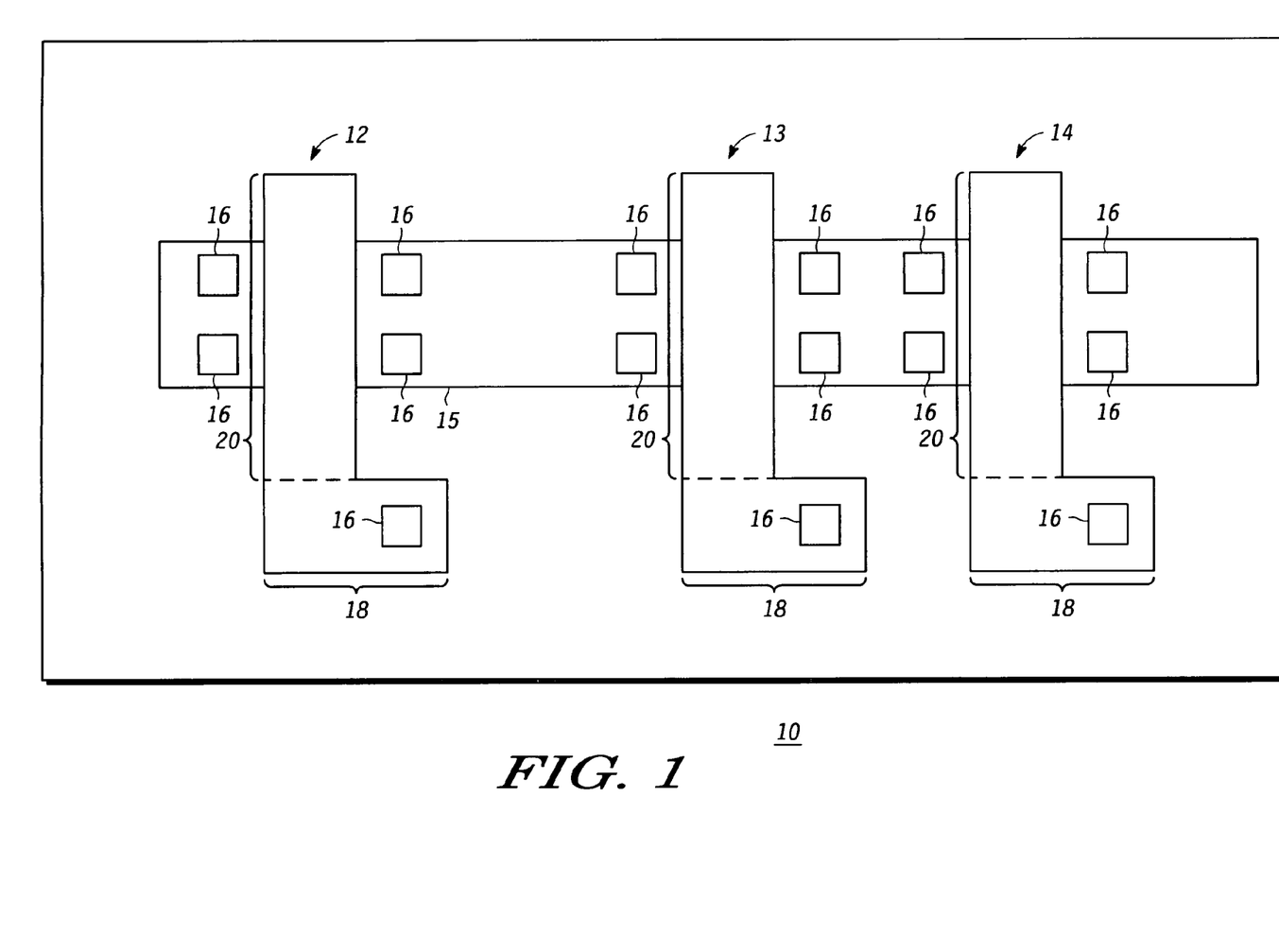
FIG. 1 illustrates a top view of a first layout portion having a plurality of features in accordance with an embodiment of the present invention.

FIG. 1 is a top view of a first layout portion 10 of an active device area used to form a semiconductor device. A skilled artisan recognizes that there may be layers and features underneath the first layout portion 10, but since the present invention is, for the most part, composed of layers, electronic components, and circuits known to those skilled in the art, details will not be explained in any greater extent than that considered necessary as illustrated below, for the understanding and appreciation of the underlying concepts of the present invention and in order not to obfuscate or distract from the teachings of the present invention.

The first layout portion 10 includes a first active circuit feature 12, a second active circuit feature 13, a third active circuit feature 14, and contacts 16. In one embodiment, the first, second and third active circuit features 12-14 are all portions of gate electrodes and may be any suitable gate electrode material, such as polysilicon. In one embodiment, portions 18 of the active circuit features 12-14 include a contact, while portions 20 do not. In the embodiment illustrates, portion 18 is a routing portion and portion 20 is a critical portion. The portion 20 is a critical portion because its performance, which is affected by its dimensions, is necessary for circuit functionality. Although, the portion 18 is needed for circuit functionality, in the embodiment described, it is not a critical portion because it is made larger due to the need to place a contact here. Thus, the dimension control and profile of the portion 18 are not as important as that for the portion 20. At least a part of the portions 20 and some of the contacts 16 are over an active device area 15. In one embodiment, the active device area 15 is a portion of an underlying semiconductor substrate that are doped with a p-type or n-type dopant. The underlying semiconductor substrate can be any semiconductor material or combinations of materials, such as gallium arsenide, silicon germanium, silicon-on-insulator (SOI) (e.g., partially depleted SOI (PDSOI) or fully depleted SOI (FDSOI)), silicon, monocrystalline silicon, the like, and combinations of the above. The p-type dopant can be any suitable dopant, such as boron if the semiconductor substrate is silicon, and the n-type dopant can be any suitable dopant, such as phosphorus if the semiconductor substrate is silicon.

From a plurality of features, such as the active circuit features 12-14 and the contacts 16, critical features are selected. In one embodiment, critical features are features for which it is important that the feature dimensions in the final structure are a predetermined dimension. For example, in one embodiment, the critical features may be the critical portions 20 of the active circuit features 12-14 if they are gate electrode features because the dimensions of the gate electrodes are important to the functionality of the final device. In another embodiment, critical features are only the gate portions that have a width between approximately 100 to 140 nanometers; larger widths are ignored although they are also gate portions.

Once the critical features, which in the embodiment illustrated are the active circuit features 12-14 or critical portions 20 of the active circuit features 12-14, are selected, the distance between each of the critical features and any other critical feature are determined. In one embodiment, distance may be a pitch or a space. Pitches and spaces can be defined in many different ways; any of these definitions may be used. In one embodiment, the distance is a pitch defined as the distance from the center of a feature to the center of an adjacent feature. In another embodiment, distance is a pitch defined as the distance from the edge of one feature to a similar edge of an adjacent feature. A pair of similar edges are ones that have the same positions relative to other edges of the feature. For example, the similar edges may both be right edges of the features, top edges of the features, etc. In yet another embodiment, the distance can be between the closest edges of one feature and an adjacent feature or any other edges. Furthermore, another definition of distance can be used provided it measures how far apart two features are from each other. When the distance between features is determined, the distance could be between the entire features or between portions of the features depending on whether the entire feature or just a portion (e.g., portion 20) is the critical feature. For example in the embodiment illustrated, for the active circuit features 12-14, only portions 20 are used to determine the distance between the active circuit features 12-14 and portions 18 may be ignored. In another embodiment, the portions 18 are also considered in determining the distance. In the embodiment illustrated in the figures, the distance is a pitch that is measured as the distance between the edge of the portion 20 of one of the active circuit features 12-14 and a similar edge of the portion 20 of another one of the active circuit features 12-14 or another active circuit feature (not shown).

Next, certain critical features are chosen. The critical features with a distance between it and the next closest feature, whether or not the feature is the same or different than the critical feature, that is greater than a predetermined distance may be selected. In one embodiment, the predetermined distance is 80 nanometers so that contacts, which are usually farther away than 80 nanometers of critical features, are not considered. In other words, a region that is within a predetermined distance is from any contact shapes is designated as an exclusion region having an exclusion distance and no dummy features are placed within this exclusion region]. Thus, in one embodiment critical features that have a distance between themselves and all other features in the same layer that is greater than approximately 80 nanometers are selected.

Figure 2:
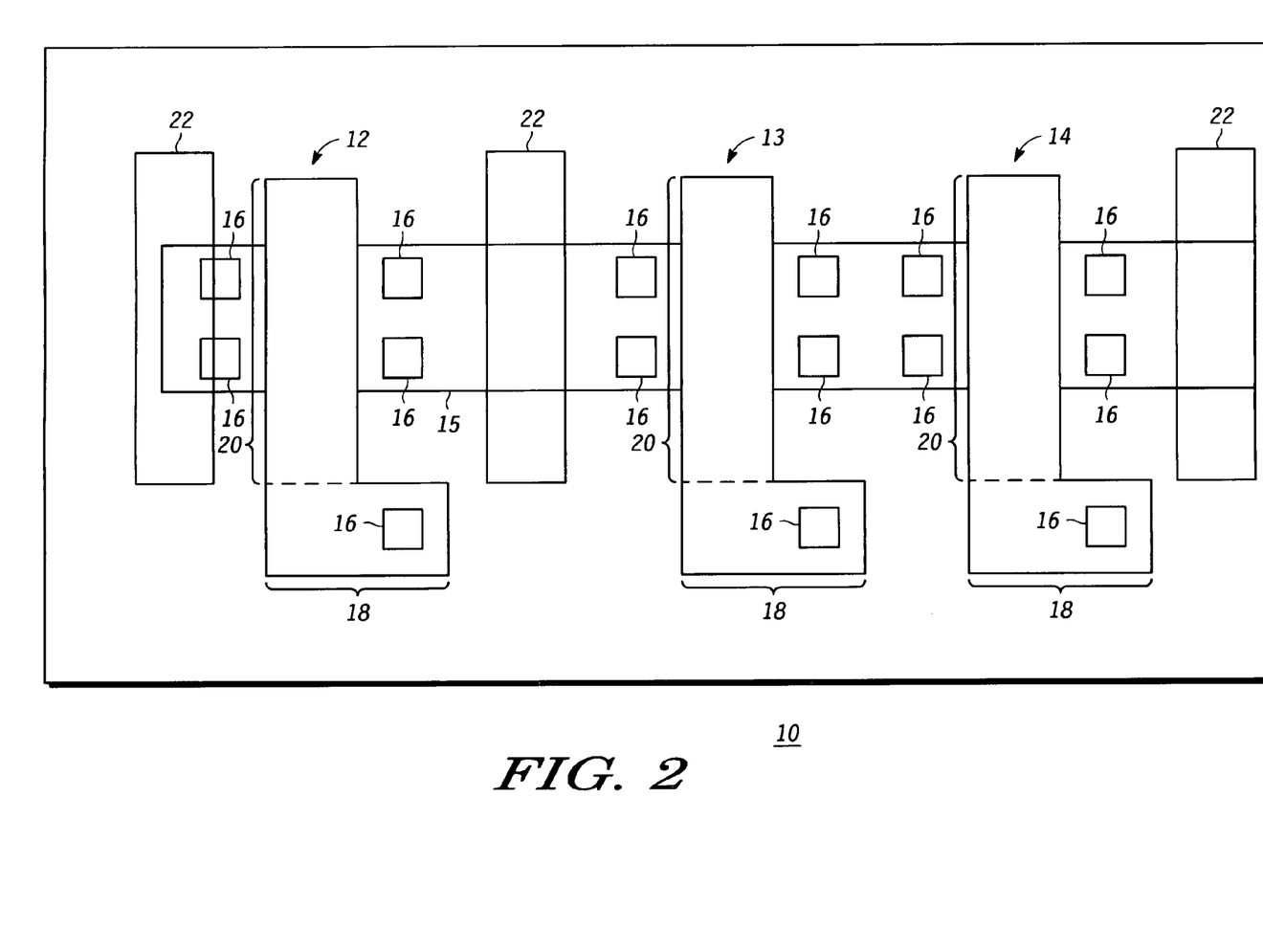
FIG. 2 illustrates the first layout portion of FIG. 1 after placing first short-range dummy etch features in accordance with an embodiment of the present invention.

At least one first short-range dummy feature is placed next to a critical feature that does not have a critical feature within the predetermined distance from it. For example, a first short-range dummy feature may be placed between critical features that have a distance greater than a predetermined distance. As shown in FIG. 2, at least one first short-range dummy feature 22 is added to the first layout portion 10 in a first iteration or process. The first short-range dummy feature 22 has a dimension so that it will be formed on the wafer during semiconductor processing. Thus, the short-range dummy features 22 are not sub-resolution features. A sub-resolution feature is a feature that that has a dimension that is not resolvable by a desired apparatus, such as a lithographic tool. Thus, sub-resolution features are present on a mask or reticle but is not present in a transferred pattern on a semiconductor wafer. In one embodiment, the first short-range dummy features 22 are dummy etch features. In this embodiment, the first short-range dummy features 22 assist the etch process by increasing the feature density near the critical feature that the first short-range dummy feature was placed near. Additionally, the dummy features 22 may help make the pattern density around the critical feature more uniform. To assist with etch processing; the dummy features are formed on the reticle and on the semiconductor device. In one embodiment, when formed on a semiconductor substrate the first short-range dummy features 22 may be the same materials as each other or any of the first, second, and third active circuit features 12-14 and formed at the same time using the same processing as the first, second, and third active circuit features 12-14. Thus, the dummy features 22 in this embodiment, may also be referred to as dummy gate features.

In the embodiment illustrated in the figures, two first short-range dummy features 22 are added. As shown in FIG. 2, a first short-range dummy feature 22 is placed on either side of the first active circuit feature 12 because the distance between the edges of the portion 20 of first active circuit feature 12 and another critical feature is greater than the predetermined distance. In one embodiment, the left side edge of the portion 20 of the first active circuit feature 12 is further from the closest critical edge of another critical feature (not shown) than the predetermined distance and likewise, the right side edge of the portion 20 of the first active circuit feature 12 is further from the closest critical edge (e.g., the left edge of the portion 20 of the second active circuit feature 13) of the second active circuit feature 13 than the predetermined distance. In one embodiment, the first short-range dummy feature 22 to the right of the first active circuit feature 12 is centered between the first and second active circuit features 12 and 13, and the first short-range dummy feature 22 to the left of the first active circuit feature 12 is a given distance from the first active circuit feature 12. The given distance may be less than or equal to the predetermined distance.

In one embodiment, more than one first short-range dummy feature 22 is placed in the first layout portion 10. Although as shown in FIG. 2, the first short-range dummy features 22 are all the same shape and dimensions, the dimensions may differ. In one embodiment, the first short-range dummy features 22 are rectangular-shaped (this includes a square shape) and the first short-range dummy features 22 all have the same width, but may have different lengths. In one embodiment, the first short-range dummy features 22 all have a width of approximately 100 to 140 nanometers and have a length from a design rule minimum, which in one embodiment is approximately 550 nanometers, to however long designed, which in one embodiment is approximately 5,000 nanometers. However, a skilled artisan recognizes that width (channel length) depends on the technology (e.g., 65 nanometer, 90 nanometer, etc.) and the length (device width) depends on the width of the active feature.

The first short-range dummy feature(s) 22 can be placed in many different ways. For example, the placement may be manual or be performed using software, such as design rule checking (DRC), optical proximity correction (OPC), or reticle enhancement technology (RET) software or a combination of the above. In an embodiment, where OPC software is used the scattering bar routine (called OPC SBAR) of the OPC software CalibreOPC® from Mentor Graphics®, which is headquartered in Wilsonville, Oreg., may be used. Alternatively, any suitable tool can be used.

Figure 3:
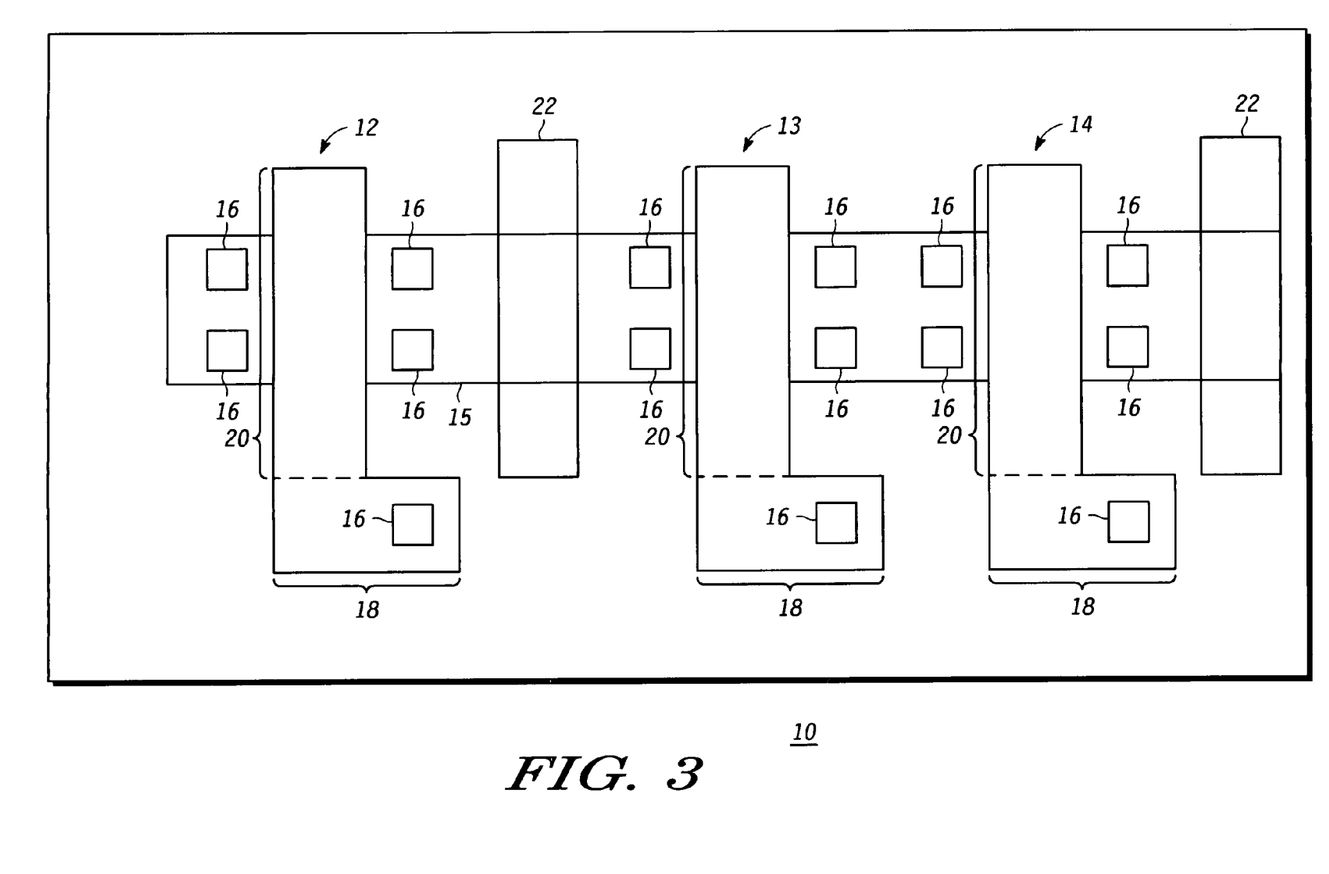
FIG. 3 illustrates the first layout portion of FIG. 2 after removing a first short-range dummy etch feature in accordance with an embodiment of the present invention.

After placing at least one first short-range dummy feature 22, the first layout portion 10 is examined to determine if any of the first short-range dummy features 22 will interfere with circuit functions. As shown in FIG. 3, the first short-range dummy feature 22 that was to the left of the first active circuit feature 12 (see FIG. 2) is removed because if it remained it would interfere with circuit functions because it overlapped a portion of the contacts 16. Interfering includes crossing, touching, or being within a pre-determined distance of a critical feature. Thus, in one embodiment any critical features that are within 80 nanometers of a contact may be removed. In other words, any dummy within a predetermined exclusion distance of other critical features are removed In one embodiment, the predetermined exclusion distance is 80 nanometers. To determine if the first short-range dummy feature 22 will interfere with circuit functions different methods can be used. For example, the method may be performed manually to determine if the first short-range dummy features 22 overlaps with or contacts any active circuit features. In another embodiment, software can be used. For example, DRC software can be used to see if the first short-range dummy features 22 overlaps with or contacts any active circuit features.

If the first short-range dummy feature 22 will interfere with the circuit function the entire first short-range dummy feature 22 is removed, not just a portion of the first short-range dummy feature. If only a portion was removed, a portion of the critical feature that was previously being protected by the first short-range dummy feature 22 is now left unprotected. Therefore, the entire first short-range dummy feature 22 is removed and a second iteration is performed, as explained below, to place another dummy feature that will not interfere with circuit functions.

Figure 4:
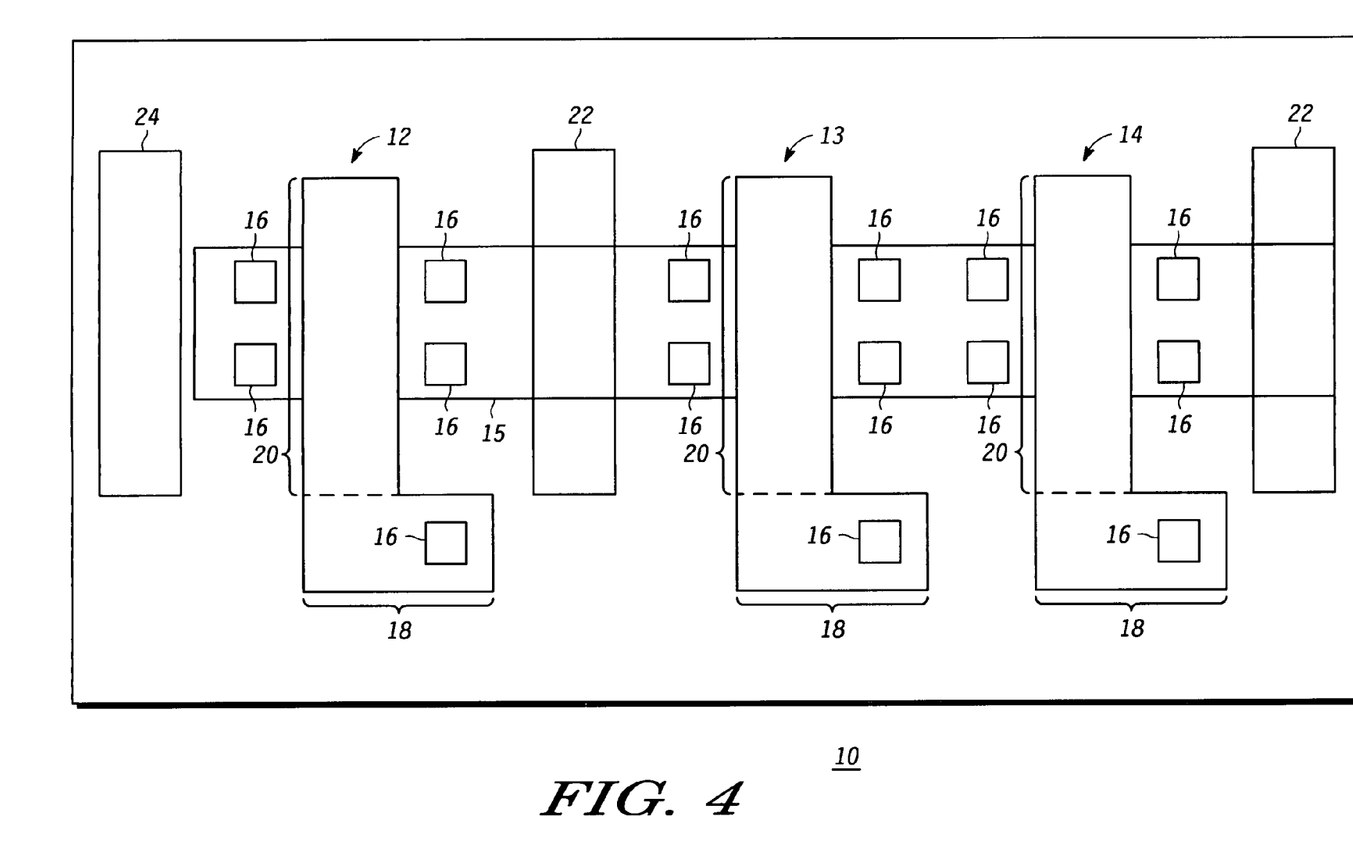
FIG. 4 illustrates the first layout portion of FIG. 3 after placing a second short-range dummy feature in accordance with an embodiment of the present invention.

During the second iteration, the same process is used as the first iteration but the distance that second short-range dummy features are placed from a critical feature is greater than the distance that the first short-range dummy features were placed from a critical feature. In addition, the second short-range dummy features are larger than the first short-range dummy features. In one embodiment, the first and second short-range dummy features are the same shape (e.g., a rectangle), but all of the first short-range dummy features have a first width and all of the second short-range dummy features all have a second width, which is greater than the first width of the first short-range dummy features. In one embodiment the second short-range dummy features are 40% wider than the first short-range dummy features. While each of the first short-range dummy features have the same width as each other, they may have different lengths, if they are rectangular in shape. Similarly, the same is true for each of the second short-range dummy features, if they are rectangular in shape. During this second iteration, the same critical features are used except that if any first short-range dummy features 22 remain in the first layout portion 10 then the short-range dummy features 22 will be treated as critical features for the second iteration. In one embodiment, an algorithm is used so that the first short-range dummy features 22 are considered in the second iteration but dummy features are not placed adjacent the first short-range dummy features to fix any etch problems with the first short-range dummy features. FIG. 4 illustrates the first layout portion 10 after performing the second iteration and placing the second short-range dummy features 24. The second short-range dummy feature 24 is formed to the left of the first active circuit feature 12 in the embodiment illustrated in FIG. 4. Unlike the first dummy feature 22 that was to the left of the first active feature 12 in FIG. 2, the second short-range dummy feature 24 does not contact or overlap the contacts 16 and thus, does not interfere with circuit functions.

While not illustrated, it is possible that at least one second short-range dummy feature 24 may interfere with circuit functions. Therefore, the first layout portion 10 may be examined after placing the second short-range dummy features 24 to determine if any of the second short-range dummy features 24 will interfere with circuit functions. To determine if any of the second short-range dummy features 24 will interfere with circuit functions any method, such as those previously described for determining if the first short-range dummy feature 22 interferes with circuit functions can be used. If a second short-range dummy feature 24 is found to interfere with circuit functions the entire second short-range dummy feature 24 may be removed or alternatively, only the portion of it that interferes with circuit functions may be removed.

Although only two iterations of forming short-range dummy features are illustrated in the figures, third, fourth, etc. iterations can be performed using the process described above wherein in each iteration the distance the short-range dummy features are placed from the critical features is increased. In one embodiment, the short-range dummy features may increase in size (e.g., width) with each iteration. Furthermore, for each iteration any dummy features previously placed should be treated as critical features.

While in one embodiment, all of the short-range dummy features are the same shape (e.g., rectangular) it is possible to overlap dummy features because this would not interfere with circuit functions. Therefore, after placing multiple dummy features the shapes may appear different (e.g., jagged) because two or more dummy features may overlap although all dummy features may have the same shape. Alternatively, each set of dummy features may have different shapes.

The placement of short-range dummy features controls the density on a local scale, such as within the first layout portion 10. In one embodiment, local scale means within approximately 5000 nanometers. In one embodiment, the first layout portion 10 is approximately 2,000 nanometers wide and approximately 1,500 nanometers long. It may be desired to increase density control on a larger scale. If so the optional process described along with FIGS. 5-6 may be performed.

In one embodiment the above processes are used and critical features are chosen that have distances between them of approximately 0.58 micrometers to 1.1 micrometers. The first short-range dummy feature is a dummy polysilicon line having a width of approximately 0.1 micrometers and is placed within the 0.58 micrometers to 1.1 micrometers distance, so the distance between a critical feature and the first short-range dummy feature is 0.24 to 0.5 micrometers after insertion. For isolated lines with distances of 1.1 micrometers or larger between them and other features, a first short-range dummy feature having a width of approximately 0.1 micrometers may be placed at 0.37 micrometers away from the isolated line. In the second iteration, a second short-range dummy feature having a width of 0.14 micrometers is inserted and centered within the distance between critical features if the distance is between 0.74 micrometers and 1.74 micrometers. The second short-range dummy feature is placed 0.66 micrometers away from a critical feature if the distance between the critical feature and another feature is larger than 1.74 micrometers.

Figure 5:
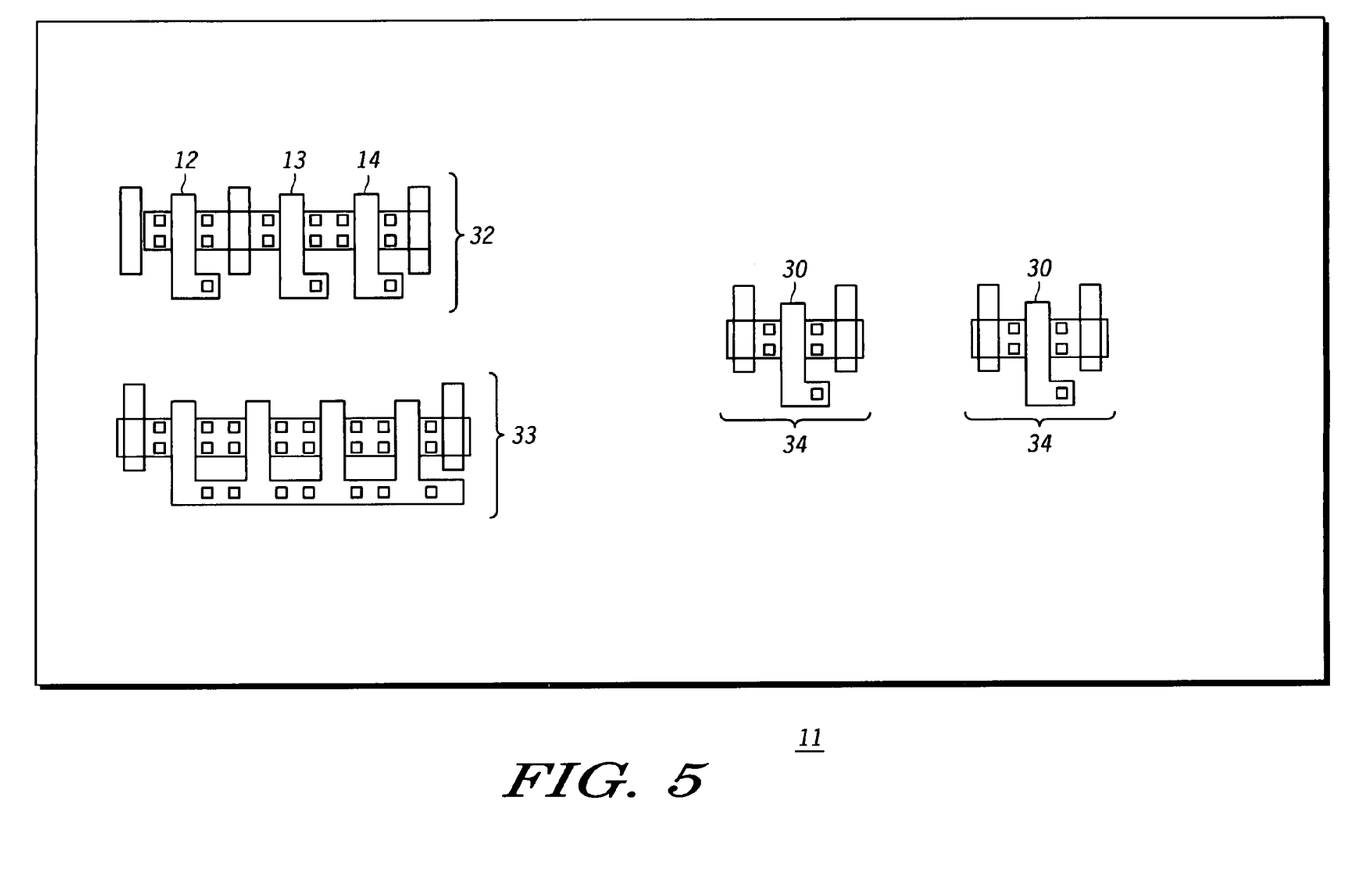
FIG. 5 illustrates a second layout portion of the layout which includes the first layout portion shown in FIG. 4.

To increase density control, especially for depth of focus during photolithography and for CMP, on a larger scale than the short-range dummy features achieved, a larger area of the layout is used. As shown in FIG. 5, a second layout portion 11, which includes the first layout portion 10, which is illustrated as region 32, is used. Regions 33 and 34 include different portions of the layout that also have had short-range dummy features placed in them near active circuit features. For example, short-range dummy features are on either side of the active circuit features 30 in regions 33 and 34.

Figure 6:
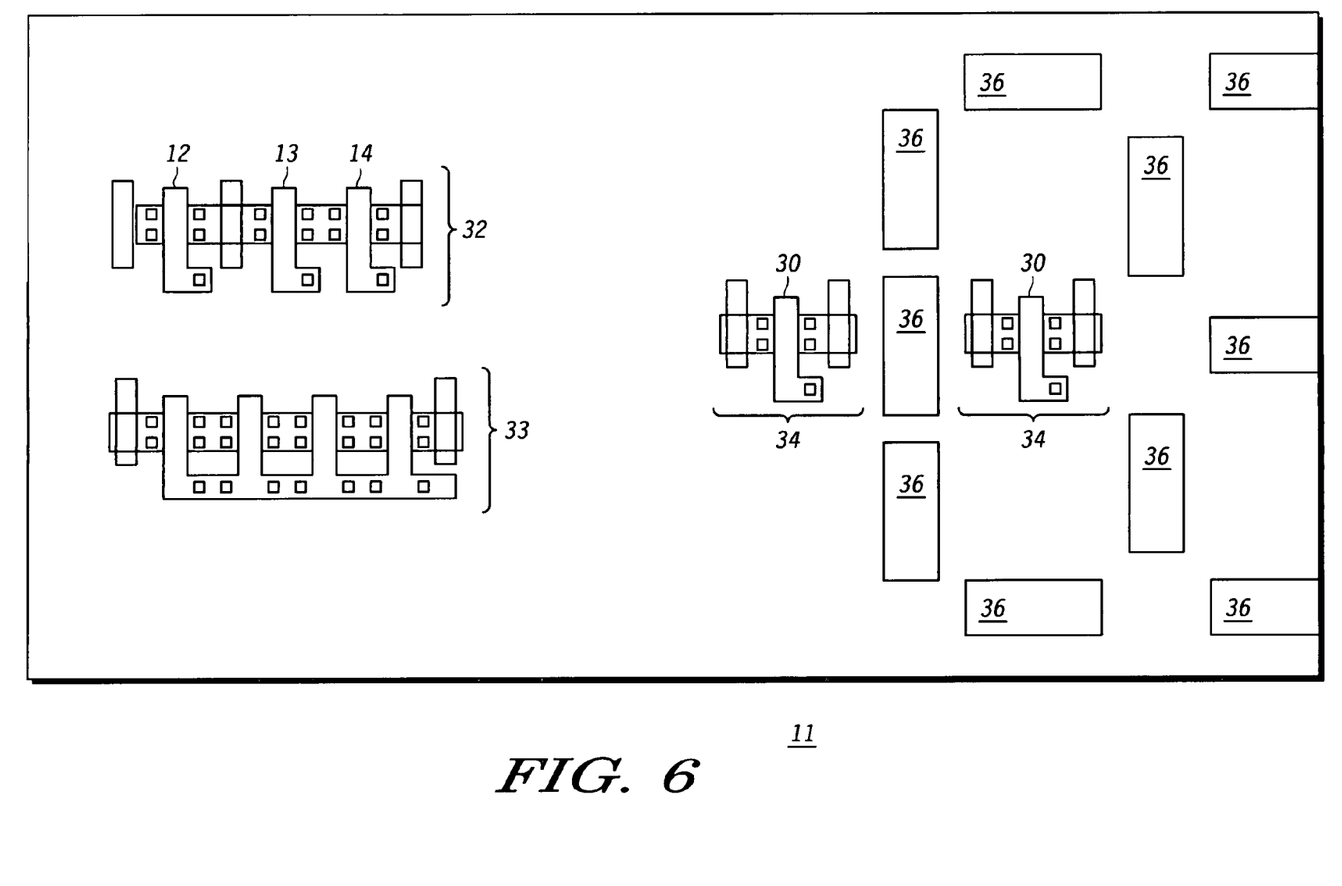
FIG. 6 illustrates the second layout portion of FIG. 5 after placing long-range dummy features in accordance with an embodiment of the present invention.

To decrease density variations, long-range dummy features 36 are placed around regions that have a lower density than desired. As shown in FIG. 6, long-range dummy features 36 are placed around region 34 so that this area of the second layout portion 11 is more similar to the denser regions 32 and 33. The long-range dummy features can be placed by various methods. For example, a tiling model method can be used. In another embodiment, a box can be drawn around an area, such as the second layout portion 11 and the density within the box can be altered by adding the long-range dummy features 36 so that it is more equal in all portions of the box. More specifically, sparse regions (e.g., region 34) are made more like dense regions (e.g., 32 and 33). In one embodiment, the box is approximately 35 to 1000 micrometers by 35 to 1000 micrometers. In another embodiment, an iteration process like that used for the short-range dummy features may be used.

Figure 7:
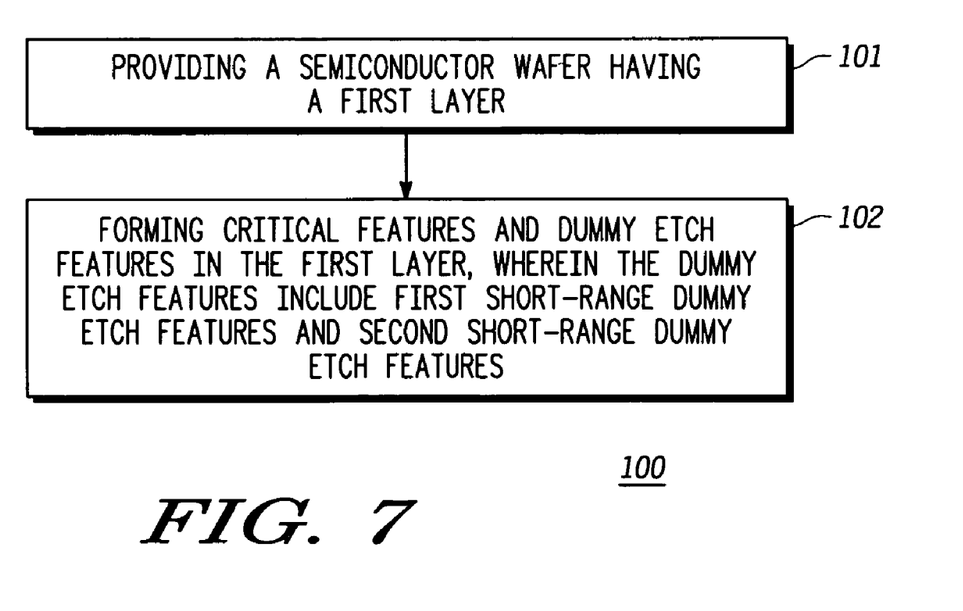
FIG. 7 illustrates a flow that can be used to form a semiconductor device in accordance with an embodiment of the present invention.

The layouts described above are subsequently used to form layers of a semiconductor device using conventional methods, such as photolithography and etch. In one embodiment, a flow 100 can be used to form a semiconductor device. First, a semiconductor having a first layer is provided 101. The first layer can be any material, such as an insulating layer or a conductive layer. Next, critical features and dummy etch features are formed it the first layer 102. The critical features and dummy etch features may be formed in the first layer using the layouts described above and photolithography and etch processing. Because one skilled in the art knows how to form a semiconductor device using a layout and understands how different layers are used to form a semiconductor device, details of such processing will not be explained in any greater extent than that considered necessary as illustrated above, for the understanding and appreciation of the underlying concepts of the present invention and in order not to obfuscate or distract from the teachings of the present invention.

The dummy features (short-range and long-range) are formed on the mask or reticle and the wafer. The features remain through the semiconductor manufacturing process when exposing the wafer to various processes. The short-range dummy features are formed close to (e.g. within approximately 1 micrometer) critical features so as to impact the critical features. In one embodiment, the dummy features are dummy etch features.

In one embodiment, a method for forming a semiconductor device includes providing a plurality of features in a layout, selecting critical features from the plurality of features, determining a plurality of first distances between each of the critical features and any of the plurality of features, placing a first short-range dummy etch feature in the layout at a first distance from a first critical feature when one of the plurality of first distances is no greater than a predetermined distance, whereby placing the first short-range dummy etch feature is performed to change feature density near one of the plurality of the critical features, determining a plurality of second distances between each of the critical features and the first short-range dummy etch features, and placing a second short-range dummy etch feature in layout at a second distance from a second critical feature when one of the plurality of the second distances is no greater than the predetermined distance, wherein the second distance is greater than the first distance. In one embodiment, the method further includes removing a first short-range dummy etch feature before the determining the plurality of second distances. In one embodiment, placing the first short-range dummy etch feature in the layout at the first distance from the first critical feature further includes placing a first short-range dummy etch features in the layout at a first distance, wherein the first distance is less than 1 micrometer. In one embodiment, placing the second short-range dummy etch feature in the layout at the second distance from the second critical features further includes placing the second short-range dummy etch feature in the layout at the second distance from the second critical features, wherein the second distance is less than 1 micrometer. In one embodiment, placing the second short-range dummy etch feature in the layout at the second distance from the second critical features further includes placing the second short-range dummy etch feature in the layout at the second distance from the second critical feature, wherein the second critical feature is different than the first critical feature. In one embodiment, placing the second short-range dummy etch feature in the layout at the second distance from the second critical features further includes placing the second short-range dummy etch feature in the layout at the second distance from the second critical features, wherein the second critical feature is the same as the first critical feature. In one embodiment, the method further includes placing long-range dummy features in the layout. In one embodiment, selecting critical features from the plurality of features further includes selecting critical features, wherein the critical features are active features. In one embodiment, selecting critical features from the plurality of features further includes selecting gate electrodes. In one embodiment, placing the first short-range dummy etch feature further includes placing from a top-view a rectangular shaped feature. In one embodiment, placing the second short-range dummy etch feature further includes placing the second short-range dummy etch feature, wherein from a top view the first short-range dummy etch feature has first dimension and the second short-range dummy etch feature has a second dimension, wherein the second dimension is different than the first dimension.

In one embodiment, a method for forming a semiconductor device includes providing a plurality of features in a layout; selecting critical features from the plurality of features, placing a first plurality of short-range dummy etch features in the layout at a first distance from the critical features to increase the feature density near the critical features, wherein each of the first plurality of short-range dummy etch features has a first width; removing at least one of the first plurality of short-range dummy etch features from the layout that will subsequently interfere with the electrical performance of at least one active feature so that a second plurality of short-range dummy etch features remains, and using the layout to pattern a layer on a semiconductor substrate. In one embodiment, the method further includes placing a third plurality of short-range dummy etch features in the layout at a second distance from critical features after removing at least one of the first plurality of short-range dummy etch features, wherein each of the third plurality of short-range dummy etch features has a second width and the second width is greater than the first width. In one embodiment, the method further includes determining distances between critical features and between critical features and adjacent short range dummy features that are part of the second plurality of short-range dummy features, and determining when the distances are less than a predetermined distance, wherein placing the third plurality of short-range dummy etch features further includes placing one of the third plurality of short-range dummy etch features adjacent a critical feature when the distance is less than the predetermined distance.

In one embodiment, a method for forming a semiconductor device includes providing a semiconductor substrate having a first layer in a layout, forming critical features and dummy etch features in the first layer, wherein the location of the dummy etch features is determined by providing a plurality of features in a first level, selecting critical features from the plurality of features, determining a plurality of first distances between each of the critical features and any other of the plurality of features, placing a first short-range dummy etch features in the layout at a first distance from a first critical feature when the first distance is no greater than a predetermined distance, whereby placing the first short-range dummy etch features is performed to increase the feature density near the critical feature, determining a plurality of second distances between each of the critical features and the first short-range dummy etch features, and placing second short-range dummy etch features in the layout at a second distance from a second critical feature when the second distance is no greater than the predetermined distance, wherein the second distance is greater than the first distance, and patterning the first layer to form the critical features, the first short-range dummy etch features, and the second short-range dummy etch features in the first layer. In one embodiment, wherein the location of the first short-range dummy etch features is further determined by removing any first short-range dummy etch features when the first short-range dummy etch feature will subsequently interfere with circuit functions, wherein the removing is performed before the placing the second short-range dummy etch features. In one embodiment, wherein placing the first short-range dummy etch features in the layout at the first distance from the first critical feature further includes placing the first short-range dummy etch features in the layout at a first distance, wherein the first distance is less than 1 micrometer. In one embodiment, wherein placing the second short-range dummy etch features in the layout at the second distance from the second critical features further includes placing the second short-range dummy etch features in the layout at the second distance from the second critical feature, wherein the second critical feature is different than the first critical feature. In one embodiment, wherein placing the second short-range dummy etch feature in the layout at the second distance from a second critical features further includes placing the second short-range dummy etch features in the layout at the second distance from the second critical features, wherein the second critical feature is the same as the first critical feature. In one embodiment, the method further includes placing long-range dummy features in the layout.

By now it should be appreciated that there has been provided a fast, robust, and efficient method for placing dummy features that does not negatively impact photolithography or CMP is needed. A process is described that allows for dummy features to be added to a design after the design is determined (i.e., post tape-out). In one embodiment the insertion of dummy features is automated and based on layout information collected through commercial DRC, OPC, or RET tools. Process models and calculations can be used to insert dummy features in a layout to improve etch uniformity and increase depth of focus for patterning while considering CMP uniformity. As should be appreciated, the dummy features can help improve etch processes and photolithography. In one embodiment where the short-range dummy features improve the photolithography process they are about 80 to 120% of the critical feature size.

In the foregoing specification, the invention has been described with reference to specific embodiments. However, one of ordinary skill in the art appreciates that various modifications and changes can be made without departing from the scope of the present invention as set forth in the claims below. For example, although the location of the dummy features is determined above based on density and distance calculations, etch and CMP models may also be used. Furthermore, different sizes, distances, and shapes of dummy features may be used. In addition, if dummy features cannot be placed due to layout constraints, sub-resolution assist features may be placed to improve photolithography even though they will not assist the etch process, like the dummy features described herein. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more.

What is claimed is:

1. A method for forming a semiconductor device, the method comprising:
   providing a plurality of features in a layout;
   selecting critical features from the plurality of features;
   determining a plurality of first distances between each of the critical features and any of the plurality of features;

placing a first short-range dummy etch feature in the layout at a first distance from a first critical feature when one of the plurality of first distances is no greater than a predetermined distance, whereby placing the first short-range dummy etch feature is performed to change feature density near one of the plurality of the critical features;

determining a plurality of second distances between each of the critical features and the first short-range dummy etch features; and placing a second short-range dummy etch feature in layout at a second distance from a second critical feature when one of the plurality of the second distances is no greater than the predetermined distance, wherein the second distance is greater than the first distance.

2. The method of claim 1, further comprising removing a first short-range dummy etch feature before the determining the plurality of second distances.

3. The method of claim 1, wherein placing the first short-range dummy etch feature in the layout at the first distance from the first critical feature further comprises placing a first short-range dummy etch features in the layout at a first distance, wherein the first distance is less than 1 micrometer.

4. The method of claim 3, wherein placing the second short-range dummy etch feature in the layout at the second distance from the second critical feature further comprises placing the second short-range dummy etch feature in the layout at the second distance from the second critical feature, wherein the second distance is less than 1 micrometer.

5. The method of claim 1, wherein placing the second short-range dummy etch feature in the layout at the second distance from the second critical feature further comprises placing the second short-range dummy etch feature in the layout at the second distance from the second critical feature, wherein the second critical feature is different than the first critical feature.

6. The method of claim 1, wherein placing the second short-range dummy etch feature in the layout at the second distance from the second critical feature further comprises placing the second short-range dummy etch feature in the layout at the second distance from the second critical feature, wherein the second critical feature is the same as the first critical feature.

7. The method of claim 1, further comprising placing long-range dummy features in the layout.

8. The method of claim 1, wherein selecting critical features from the plurality of features further comprises selecting critical features, wherein the critical features are active features.

9. The method of claim 1, wherein selecting critical features from the plurality of features further comprises selecting gate electrodes.

10. The method of claim 1, wherein placing the first short-range dummy etch feature further comprises placing from a top-view a rectangular shaped feature.

11. The method of claim 1, wherein placing the second short-range dummy etch feature further comprises placing the second short-range dummy etch feature, wherein from a top view the first short-range dummy etch feature has a first dimension and the second short-range dummy etch feature has a second dimension, wherein the second dimension is different than the first dimension.

12. A method for forming a semiconductor device, the method comprising:

providing a plurality of features in a layout;

selecting critical features from the plurality of features;

placing a first plurality of short-range dummy etch features in the layout at a first distance from the critical, wherein each of the first plurality of short-range dummy etch features has a first width;

removing at least one of the first plurality of short-range dummy etch features from the layout so that a second plurality of short-range dummy etch features remains;

placing a third plurality of short-range dummy etch features in the layout at a second distance from critical features after removing at least one of the first plurality of short-range dummy etch features, wherein each of the third plurality of short-range dummy etch features has a second width and the second width is greater than the first width; and using the layout to pattern a layer on a semiconductor substrate.

13. The method of claim 12, further comprising:

determining distances between critical features and between critical features and adjacent short range dummy features that are part of the second plurality of short-range dummy features;

determining when the distances are less than a predetermined distance; and wherein placing the third plurality of short-range dummy etch features further comprises placing the one of the third plurality of short-range dummy etch features adjacent a critical feature when the distance is less than the predetermined distance.

14. A method for forming a semiconductor device, the method comprising:

providing a semiconductor substrate having a first layer;

forming critical features and dummy etch features in the first layer, wherein locations of the dummy etch features are determined by:

providing a plurality of features in a first level of a layout;

selecting critical features from the plurality of features;

determining a plurality of first distances between each of the critical features and any other of the plurality of features;

placing a first short-range dummy etch features in the layout at a first distance from a first critical feature when the first distance is no greater than a predetermined distance;

determining a plurality of second distances between each of the critical features and the first short-range dummy etch features; and placing second short-range dummy etch features in the layout at a second distance from a second critical feature when the second distance is no greater than the predetermined distance, wherein the second distance is greater than the first distance; and patterning the first layer to form the critical features, the first short-range dummy etch features, and the second short-range dummy etch features in the first layer.

15. The method of claim 14, wherein the locations of the first short-range dummy etch features are further determined by removing any first short-range dummy etch features when the first short-range dummy etch feature will subsequently interfere with circuit functions, wherein the removing is performed before the placing the second short-range dummy etch features.

16. The method of claim 14, wherein placing the first short-range dummy etch features in the layout at the first distance from the first critical feature further comprises placing the first short-range dummy etch features in the layout at a first distance, wherein the first distance is less than 1 micrometer.

17. The method of claim 14, wherein placing the second short-range dummy etch features in the layout at the second distance from the second critical feature further comprises placing the second short-range dummy etch feature in the layout at the second distance from the second critical feature, wherein the second critical feature is different than the first critical feature.

18. The method of claim 14, wherein placing the second short-range dummy etch feature in the layout at the second distance from a second critical feature further comprises placing the second short-range dummy etch features in the layout at the second distance from the second critical feature, wherein the second critical feature is the same as the first critical feature.

19. The method of claim 14, further comprising placing long-range dummy features in the layout.

* * * * *